(12) United States Patent
Uchida

(10) Patent No.: US 12,543,342 B2
(45) Date of Patent: Feb. 3, 2026

(54) SILICON CARBIDE SEMICONDUCTOR DEVICE

(71) Applicant: SUMITOMO ELECTRIC INDUSTRIES, LTD., Osaka (JP)

(72) Inventor: Kosuke Uchida, Osaka (JP)

(73) Assignee: SUMITOMO ELECTRIC INDUSTRIES, LTD., Osaka (JP)

( * ) Notice: Subject to any disclaimer, the term of this patent is extended or adjusted under 35 U.S.C. 154(b) by 384 days.

(21) Appl. No.: 18/246,407

(22) PCT Filed: Aug. 30, 2021

(86) PCT No.: PCT/JP2021/031694
§ 371 (c)(1),
(2) Date: Mar. 23, 2023

(87) PCT Pub. No.: WO2022/137649
PCT Pub. Date: Jun. 30, 2022

(65) Prior Publication Data
US 2023/0361211 A1     Nov. 9, 2023

(30) Foreign Application Priority Data
Dec. 23, 2020   (JP) .................. 2020-213691

(51) Int. Cl.
*H10D 30/66*      (2025.01)
*H10D 12/01*      (2025.01)
(Continued)

(52) U.S. Cl.
CPC ......... *H10D 30/668* (2025.01); *H10D 12/031* (2025.01); *H10D 62/127* (2025.01);
(Continued)

(58) Field of Classification Search
CPC .. H10D 30/668; H10D 62/127; H10D 62/152; H10D 62/393; H10D 62/8325; H10L 2/031
(Continued)

(56) References Cited

U.S. PATENT DOCUMENTS

2012/0012860 A1   1/2012   Miyahara et al.
2019/0181261 A1   6/2019   Okumura
(Continued)

FOREIGN PATENT DOCUMENTS

JP   2012-023291   2/2012
JP   2016-040844   3/2016
(Continued)

*Primary Examiner* — Fazli Erdem
(74) *Attorney, Agent, or Firm* — IPUSA, PLLC

(57) ABSTRACT

A silicon carbide semiconductor device includes a silicon carbide substrate having a first main surface and a second main surface opposite to the first main surface. The silicon carbide substrate includes a drift region being a first-conductivity type, a body region being a second-conductivity type and provided on the drift region, a source region being the first-conductivity type and provided on the body region such that the source region is separated from the drift region, a contact region being the second-conductivity type and provided on the body region. Gate trenches are provided in the first main surface, and extend in a first direction parallel to the first main surface. The contact region is in contact with a first gate trench from both sides in a second direction orthogonal to the first direction and spaced apart from a second gate trench adjacent to the first gate trench in the second direction.

11 Claims, 18 Drawing Sheets

(51) Int. Cl.
*H10D 62/10* (2025.01)
*H10D 62/13* (2025.01)
*H10D 62/17* (2025.01)
*H10D 62/832* (2025.01)

(52) U.S. Cl.
CPC ......... *H10D 62/152* (2025.01); *H10D 62/393* (2025.01); *H10D 62/8325* (2025.01)

(58) Field of Classification Search
USPC .......................................................... 257/77
See application file for complete search history.

(56) References Cited

U.S. PATENT DOCUMENTS

| 2020/0083369 | A1  | 3/2020  | Kobayashi et al. |               |
|--------------|-----|---------|------------------|---------------|
| 2020/0098910 | A1* | 3/2020  | Nakagawa         | H10D 64/513   |
| 2022/0384566 | A1* | 12/2022 | Saitoh           | H01L 21/046   |

FOREIGN PATENT DOCUMENTS

| JP | 2019-106483 | 6/2019 |
| JP | 2020-043243 | 3/2020 |
| JP | 2020-512682 | 4/2020 |
| WO | 2017/126472 | 7/2017 |
| WO | 2018/106325 | 6/2018 |

\* cited by examiner

SILICON CARBIDE SEMICONDUCTOR DEVICE

TECHNICAL FIELD

The present disclosure relates to a silicon carbide semiconductor device.

This application is based on and claims priority to Japanese Patent Application No. 2020-213691 filed on Dec. 23, 2020, the entire contents of which are incorporated herein by reference.

BACKGROUND ART

As one of silicon carbide semiconductor devices, a trench gate type metal oxide semiconductor field effect transistor (MOSFET), in which a contact region connected to a body region is discontinuously arranged along a gate trench inside a contact hole formed in an interlayer insulating film, is disclosed (for example, Patent Document 1).

RELATED ART DOCUMENTS

Patent Documents

[Patent Document 1] Japanese Unexamined Patent Application Publication No. 2012-23291

SUMMARY OF THE INVENTION

A silicon carbide semiconductor device of the present disclosure includes a silicon carbide substrate having a first main surface and a second main surface opposite to the first main surface. The silicon carbide substrate includes a drift region that is a first conductivity type, a body region that is a second conductivity type different from the first conductivity type and that is provided on the drift region, a source region that is the first conductivity type and that is provided on the body region such that the source region is separated from the drift region, a contact region that is the second conductivity type and that is provided on the body region. A plurality of gate trenches are provided in the first main surface. Each of the plurality of gate trenches is defined by side surfaces and a bottom surface. The side surfaces pass through the source region and the body region to reach the drift region. The bottom surface is continuous with the side surfaces. The plurality of gate trenches extend in a first direction parallel to the first main surface. The contact region is in contact with a first gate trench from both sides in a second direction orthogonal to the first direction and is spaced apart from a second gate trench adjacent to the first gate trench in the second direction. The first gate trench is one gate trench among the plurality of gate trenches.

EMBODIMENT FOR CARRYING OUT THE INVENTION

Figure 1:
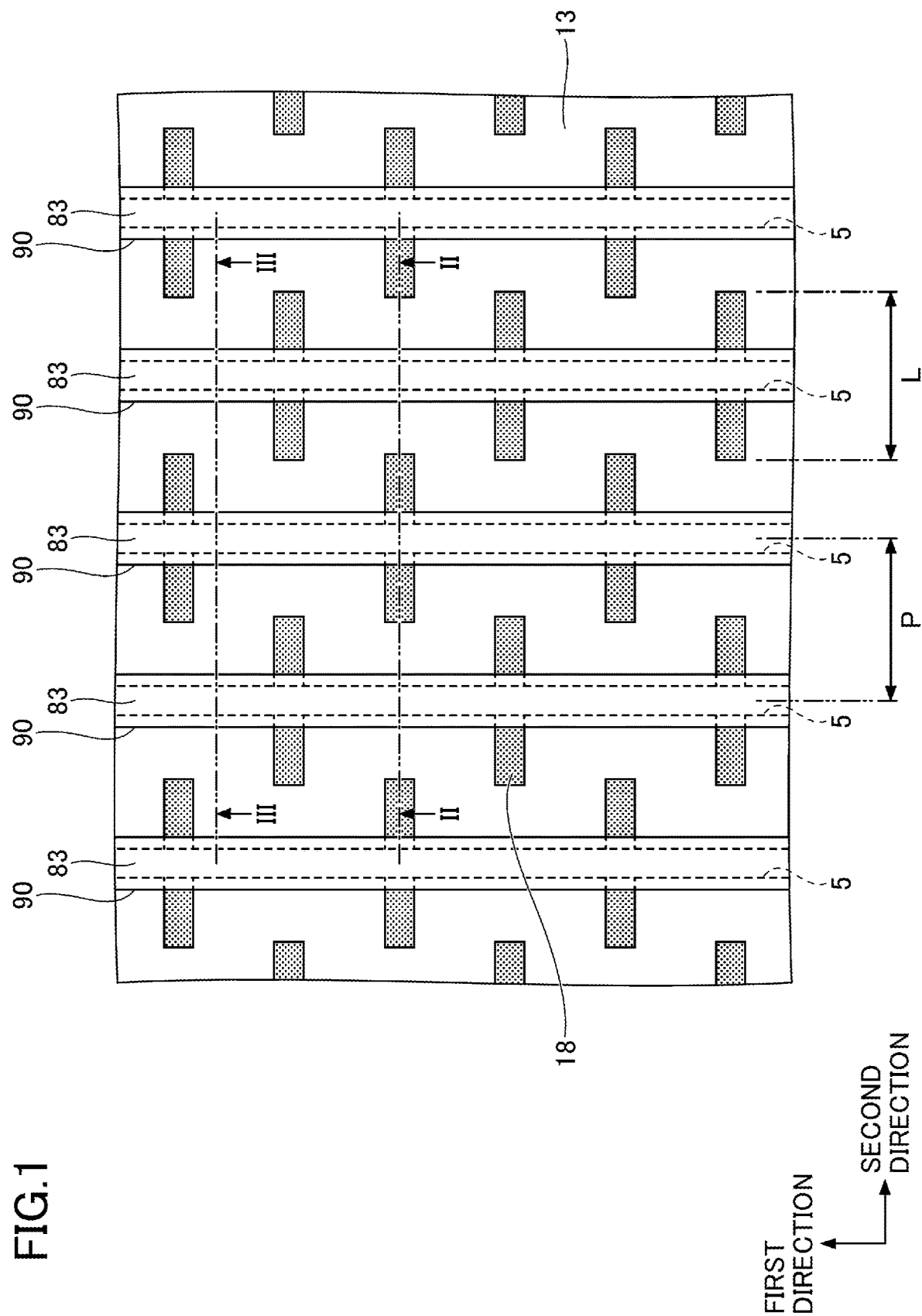
FIG. 1 is a diagram illustrating a relationship between an interlayer insulating film, a source region, and a contact region in a silicon carbide semiconductor device according to an embodiment.

Problems to be Solved by the Present Disclosure

In a conventional MOSFET in which a contact region is discontinuously arranged, the uniformity of temperature distribution during operation tends to be low. This is because a current between the source and the drain flows through the source region but does not flow through the contact region, so that temperature unevenness is likely to be caused. Additionally, in the case where the contact region is disposed inside the contact hole, if a shift in a position of a pattern occurs during manufacturing, the area of the contact region becomes insufficient, and the characteristics fluctuate.

It is an object of the present disclosure to provide a silicon carbide semiconductor device that can improve the uniformity of the temperature distribution during operation.

Effects of the Present Disclosure

According to the present disclosure, the uniformity of the temperature distribution during operation can be improved.

Embodiments will be described below.

DESCRIPTION OF THE EMBODIMENTS OF THE PRESENT DISCLOSURE

First, the embodiments of the present disclosure will be listed and described. In the following description, identical or corresponding elements are denoted by the same reference signs and will not be described repeatedly. In the crystallographic description in the present specification, an individual orientation is indicated by [ ], a group orientation is indicated by < >, an individual plane is indicated by ( ), and a group plane is indicated by { }. Additionally, a negative crystallographic index is usually expressed by putting "-" (bar) above a number, but in the present specification, a negative sign is put before a number.

[1] A silicon carbide semiconductor device according to one aspect of the present disclosure includes a silicon carbide substrate having a first main surface and a second main surface opposite to the first main surface. The silicon carbide substrate includes a drift region that is a first conductivity type, a body region that is a second conductivity type different from the first conductivity type and that is provided on the drift region, a source region that is the first conductivity type and that is provided on the body region such that the source region is separated from the drift region, a contact region that is the second conductivity type and that is provided on the body region. A plurality of gate trenches are provided in the first main surface. Each of the plurality of gate trenches is defined by side surfaces and a bottom surface. The side surfaces pass through the source region and the body region to reach the drift region. The bottom surface is continuous with the side surfaces. The plurality of gate trenches extend in a first direction parallel to the first main surface. The contact region is in contact with a first gate trench from both sides in a second direction orthogonal to the first direction and is spaced apart from a second gate trench adjacent to the first gate trench in the second direction. The first gate trench is one gate trench among the plurality of gate trenches.

The contact region is spaced apart from the second gate trench while the contact region is in contact with the first gate trench. When the contact region is in contact with the first gate trench and the second gate trench, the source region is divided by the contact region in the first direction. The source region becomes a conductive region and the contact region becomes a non-conductive region in the on-state, so that, in this case, the conductive region is divided by the non-conductive region in the first direction. With respect to the above, in the silicon carbide semiconductor device according to the one aspect of the present disclosure, the source region is present between the second gate trench and the contact region, and the source region continues in the first direction. Therefore, according to the silicon carbide semiconductor device of one aspect of the present disclosure, the conductive region that continues in the first direction can be obtained. Additionally, although heat is generated when a current flows, the conduction region continues in the first direction, so that the uniformity of heat generation can be improved and the uniformity of temperature distribution can be improved. Furthermore, the contact region is in contact with the first gate trench from both sides in the second direction, so that the total area of the contact region can be kept constant even if a shift in a position of a pattern occurs during forming the contact region. Therefore, even if a shift in the position of the contact region occurs, stable characteristics can be obtained.

[2] In [1], the plurality of gate trenches may be arrayed at a first pitch in the second direction, and a size of the contact region in the second direction may be 0.90 times the first pitch or greater and 1.10 times the first pitch or less. In this case, a potential is easily applied to the body region through the contact region, and a sufficient current easily flows through the source region.

[3] In [1] or [2], a plurality of said contact regions may be arranged along the first gate trench in the first direction. In this case, the uniformity of the temperature distribution is easily improved.

[4] In any one of [1] to [3], the source region may continue in the first direction between the first gate trench and the second gate trench. In this case, a large current easily flows.

[5] In any one of [1] to [4], a plurality of said contact regions may be arranged at every other one of the plurality of gate trenches in the second direction. In this case, a large current easily flows and a potential is easily applied to the body region through the contact region.

[6] In any one of [1] to [5], a plurality of said contact regions may be arranged in an oblique lattice shape with respect to the first direction and the second direction. In this case, a large current easily flows and a potential is easily applied to the body region through the contact region.

[7] In any one of [1] to [6], the side surfaces of each of the plurality of gate trenches may include a {0-33-8} plane or a {11-20} plane. In this case, good mobility is obtained on the side surface of the gate trench, and the channel resistance can be reduced.

EMBODIMENT OF THE PRESENT DISCLOSURE

Figure 2:
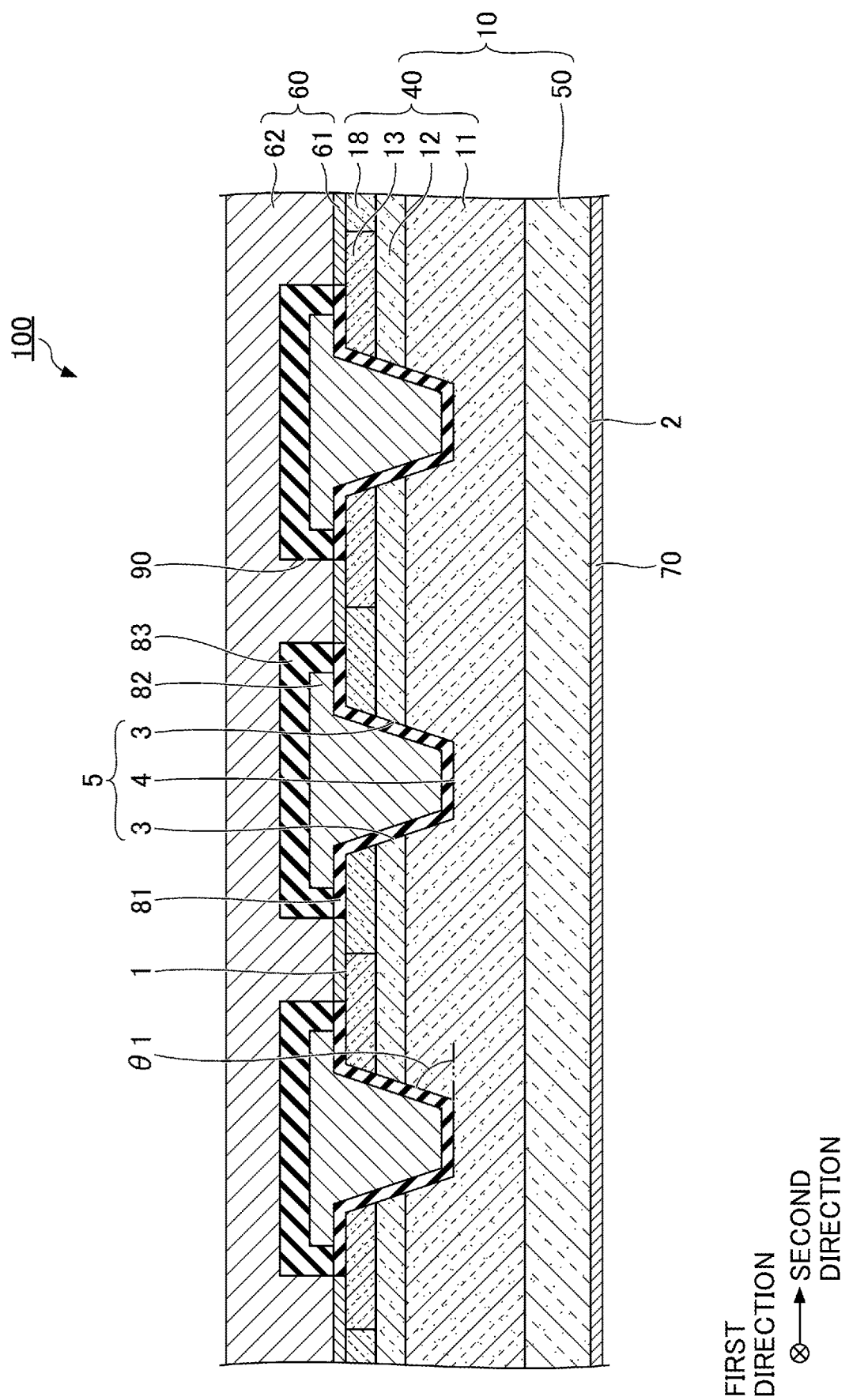
FIG. 2 is a cross-sectional view (part 1) illustrating a configuration of the silicon carbide semiconductor device according to the embodiment.
Figure 3:
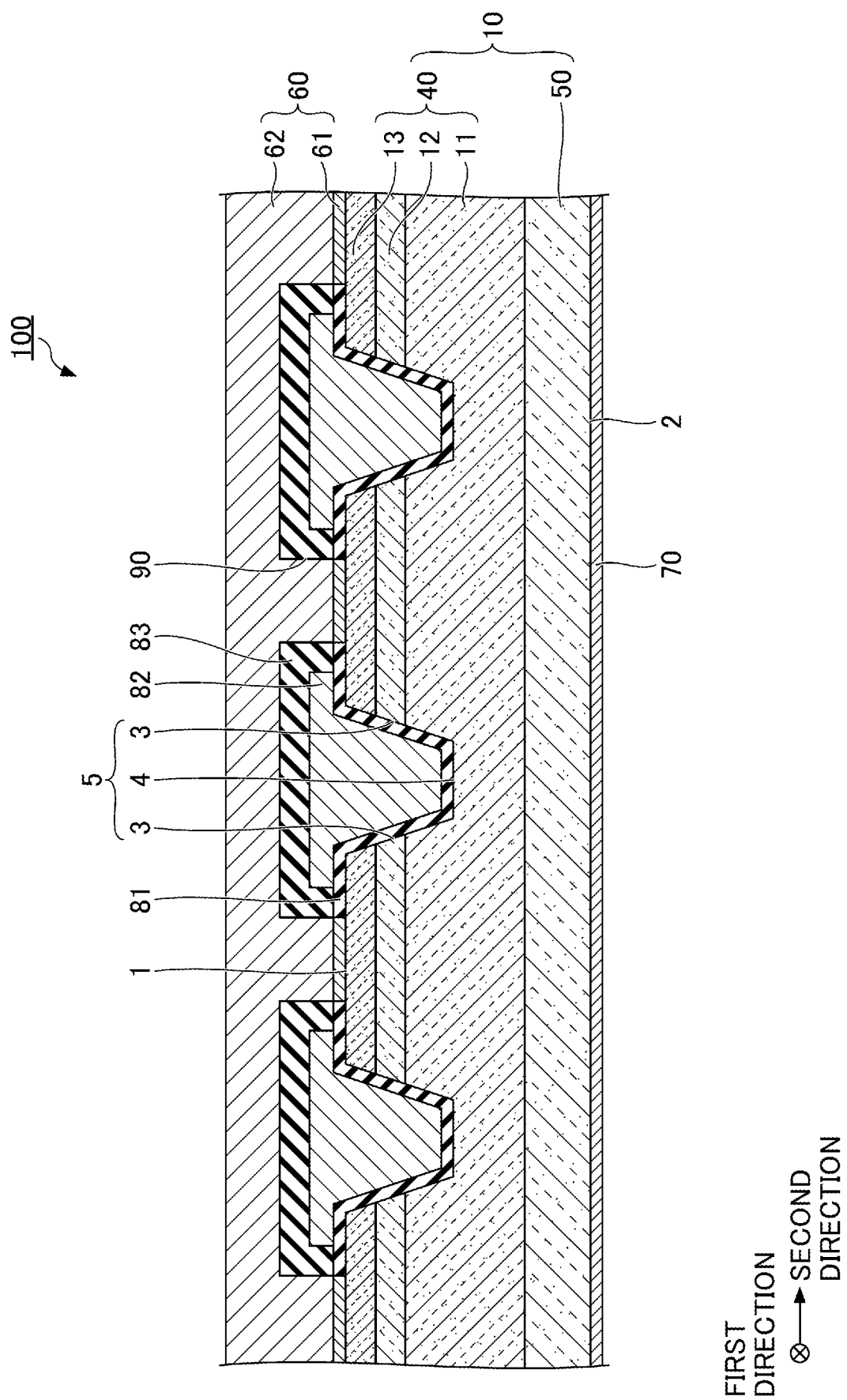
FIG. 3 is a cross-sectional view (part 2) illustrating the configuration of the silicon carbide semiconductor device according to the embodiment.

The embodiment of the present disclosure relates to what is called a vertical MOSFET (a silicon carbide semiconductor device). FIG. 1 is a diagram illustrating a relationship between an interlayer insulating film, the source region, and the contact region in the silicon carbide semiconductor device according to the embodiment. FIG. 2 and FIG. 3 are cross-sectional views illustrating a configuration of the silicon carbide semiconductor device according to the embodiment. FIG. 1 corresponds to a plan view illustrating an arrangement of the gate trench, the source region, and the contact region in the first main surface of the silicon carbide substrate. FIG. 2 corresponds to a cross-sectional view taken along the line II-II in FIG. 1. FIG. 3 corresponds to a cross-sectional view taken along the line III-III in FIG. 1.

As illustrated in FIGS. 1 to 3, a MOSFET 100 according to the present embodiment mainly includes a silicon carbide substrate 10, a gate insulating film 81, a gate electrode 82, an interlayer insulating film 83, a source electrode 60, and a drain electrode 70. The silicon carbide substrate 10 includes a silicon carbide single-crystal substrate 50 and a silicon carbide epitaxial layer 40 provided on the silicon carbide single-crystal substrate 50. The silicon carbide substrate 10 has a first main surface 1 and a second main surface 2 opposite to the first main surface 1. The silicon carbide epitaxial layer 40 forms the first main surface 1, and the silicon carbide single-crystal substrate 50 forms the second main surface 2. The silicon carbide single-crystal substrate 50 and the silicon carbide epitaxial layer 40 are made of, for example, hexagonal silicon carbide of polytype 4H. The silicon carbide single-crystal substrate 50 includes a donor (n-type impurity) such as nitrogen (N) and has an n-type (a first conductivity type).

The first main surface 1 is a {0001} plane or a plane inclined from the {0001} plane by an off angle of 8° or less in the off direction. Preferably, the first main surface 1 is a (000-1) plane or a plane inclined from the (000-1) plane by an off angle of 8° or less in the off direction. The off direction may be, for example, the <11-20> direction or the <1-100> direction. The off angle may be, for example, 1° or greater, or 2° or greater. The off angle may be 6° or less, or may be 4° or less.

The silicon carbide epitaxial layer 40 mainly includes a drift region 11, a body region 12, a source region 13, and a contact region 18.

The drift region 11 is the n-type by a donor such as nitrogen or phosphorus (P) being added, for example. It is preferable that the donor is added to the drift region 11 not by ion implantation but by impurity addition during epitaxial growth of the drift region 11. The donor concentration of the drift region 11 is preferably lower than the donor concentration of the silicon carbide single-crystal substrate 50. The donor concentration of the drift region 11 is preferably $1 \times 10^{15}$ cm$^{-3}$ or greater and $5 \times 10^{16}$ cm$^{-3}$ or less, and is, for example, about $8 \times 10^{15}$ cm$^{-3}$.

The body region 12 is provided on the drift region 11. The body region 12 is a p-type (a second conductivity type) by an acceptor (p-type impurity) such as aluminum (Al) being added, for example. The acceptor concentration of the body region 12 is, for example, about $1 \times 10^{18}$ cm$^{-3}$.

The source region 13 is provided on the body region 12 such that the source region 13 is separated from the drift region 11 by the body region 12. The source region 13 is the n-type by a donor such as nitrogen or phosphorus being added, for example. The source region 13 forms the first main surface 1. The donor concentration of the source region 13 is, for example, about $1 \times 10^{19}$ cm$^{-3}$.

The contact region 18 is the p-type by an acceptor such as aluminum being added, for example. The contact region 18 forms the first main surface 1. The contact region 18 passes through the source region 13 and comes in contact with the body region 12. The acceptor concentration of the contact region 18 is $1 \times 10^{18}$ cm$^{-3}$ or greater and $1 \times 10^{20}$ cm$^{-3}$ or less, for example.

Multiple gate trenches 5 are provided in the first main surface 1. The gate trench 5 extends, for example, in a first direction parallel to the first main surface 1, and the multiple gate trenches 5 are arranged in a second direction parallel to the first main surface 1 and orthogonal to the first direction. The gate trench 5 has a bottom surface 4 formed by the drift region 11. The gate trench 5 has side surfaces 3 that pass through the contact region 18, the source region 13, and the body region 12 and that are continuous with the bottom surface 4. The bottom surface 4 is, for example, a plane parallel to the second main surface 2. An angle θ1 of the side surface 3 with respect to a plane including the bottom surface 4 is, for example, 45° or greater and 65° or less. The angle θ1 may be, for example, 50° or greater. The angle θ1 may be, for example, 60° or less. The side surface 3 preferably has a {0-33-8} plane or a {11-20} plane. The {0-33-8} plane and the {11-20} plane are crystal planes in which excellent mobility is obtained.

The multiple contact regions 18 are arranged along the gate trenches 5 in the first direction. Each contact region 18 is in contact with one gate trench 5 among the multiple gate trenches 5 from both sides in the second direction. When the gate trench 5 that is contact with the contact region 18 is referred to as a first gate trench and the gate trench 5 adjacent to the first gate trench in the second direction is referred to as a second gate trench, the contact region 18 is spaced apart from the second gate trench. The source region 13 may be disposed between the contact region 18 and the second gate trench. The source region 13 may continue in the first direction between the first gate trench and the second gate trench. The multiple contact regions 18 may be arranged in the second direction at every other one of the multiple gate trenches 5. The multiple contact regions 18 may be arranged in an oblique lattice pattern with respect to the first direction and the second direction.

The gate insulating film 81 is, for example, an oxide film. The gate insulating film 81 is made of, for example, a material containing silicon dioxide. The gate insulating film 81 is in contact with the side surface 3 and the bottom surface 4. The gate insulating film 81 is in contact with the drift region 11 at the bottom surface 4. The gate insulating film 81 is in contact with each of the contact region 18, the source region 13, the body region 12, and the drift region 11 at the side surface 3. The gate insulating film 81 may be in contact with the source region 13 at the first main surface 1.

The gate electrode 82 is provided on the gate insulating film 81. The gate electrode 82 is made of, for example, polysilicon (poly-Si) containing conductive impurities. The gate electrode 82 is disposed inside the gate trench 5.

The interlayer insulating film 83 is provided in contact with the gate electrode 82 and the gate insulating film 81. The interlayer insulating film 83 is made of, for example, a material containing silicon dioxide. The interlayer insulating film 83 electrically insulates the gate electrode 82 from the source electrode 60.

Contact holes 90 are formed in the interlayer insulating film 83 and the gate insulating film 81 at constant intervals in the second direction. The contact holes 90 are provided such that the gate trench 5 is positioned between the contact holes 90 adjacent to each other in the second direction. The contact hole 90 extends in the first direction. The source region 13 and the contact region 18 are exposed from the interlayer insulating film 83 and the gate insulating film 81 through the contact hole 90.

The source electrode 60 is in contact with the first main surface 1. The source electrode 60 includes a contact electrode 61 provided in the contact hole 90 and a source wiring 62. The contact electrode 61 is in contact with the source region 13 and the contact region 18 in the first main surface 1. The contact electrode 61 is made of, for example, a material containing nickel silicide (NiSi). The contact electrode 61 may be made of a material containing titanium (Ti), Al, and Si. The contact electrode 61 is in ohmic contact with the source region 13 and the contact region 18. The source wiring 62 covers the upper surface and the side surface of the interlayer insulating film 83 and the upper surface of the contact electrode 61. The source wiring 62 is in contact with the contact electrode 61. The source wiring 62 is made of, for example, a material containing Al.

The drain electrode 70 is in contact with the second main surface 2. The drain electrode 70 is in contact with the silicon carbide single-crystal substrate 50 at the second main surface 2. The drain electrode 70 is electrically connected to the drift region 11. The drain electrode 70 is made of, for example, a material containing NiSi. The drain electrode 70 may be made of a material containing Ti, Al, and Si. The drain electrode 70 is in ohmic contact with the silicon carbide single-crystal substrate 50.

Here, the acceptor concentration and the donor concentration of each of the impurity regions can be measured by a measurement using a scanning capacitance microscope (SCM), secondary ion mass spectrometry (SIMS), or the like, for example.

Figure 13:
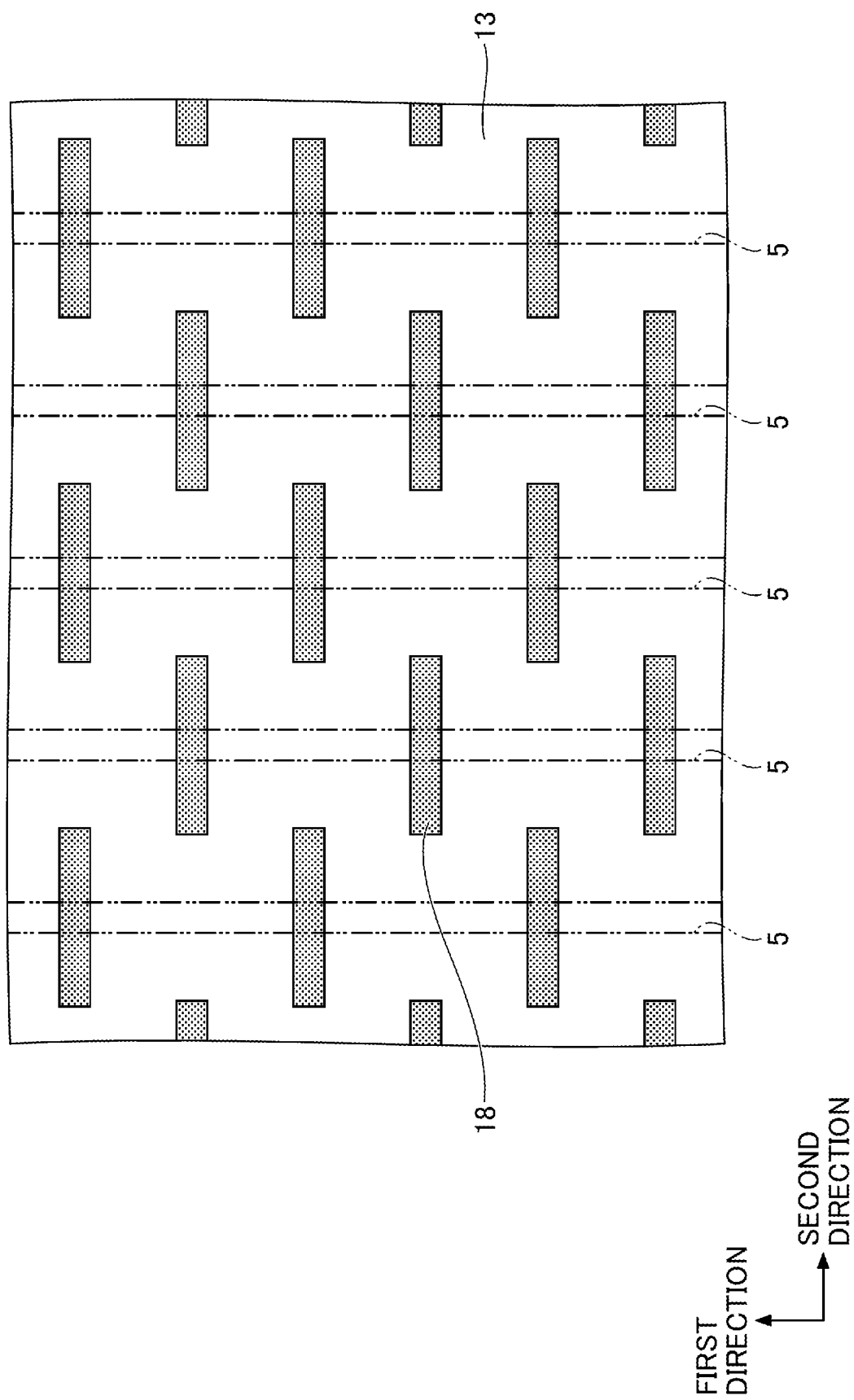
FIG. 13 is a diagram illustrating a relationship between the source region and the contact region in the method of manufacturing the silicon carbide semiconductor device in accordance with the embodiment.
Figure 14:
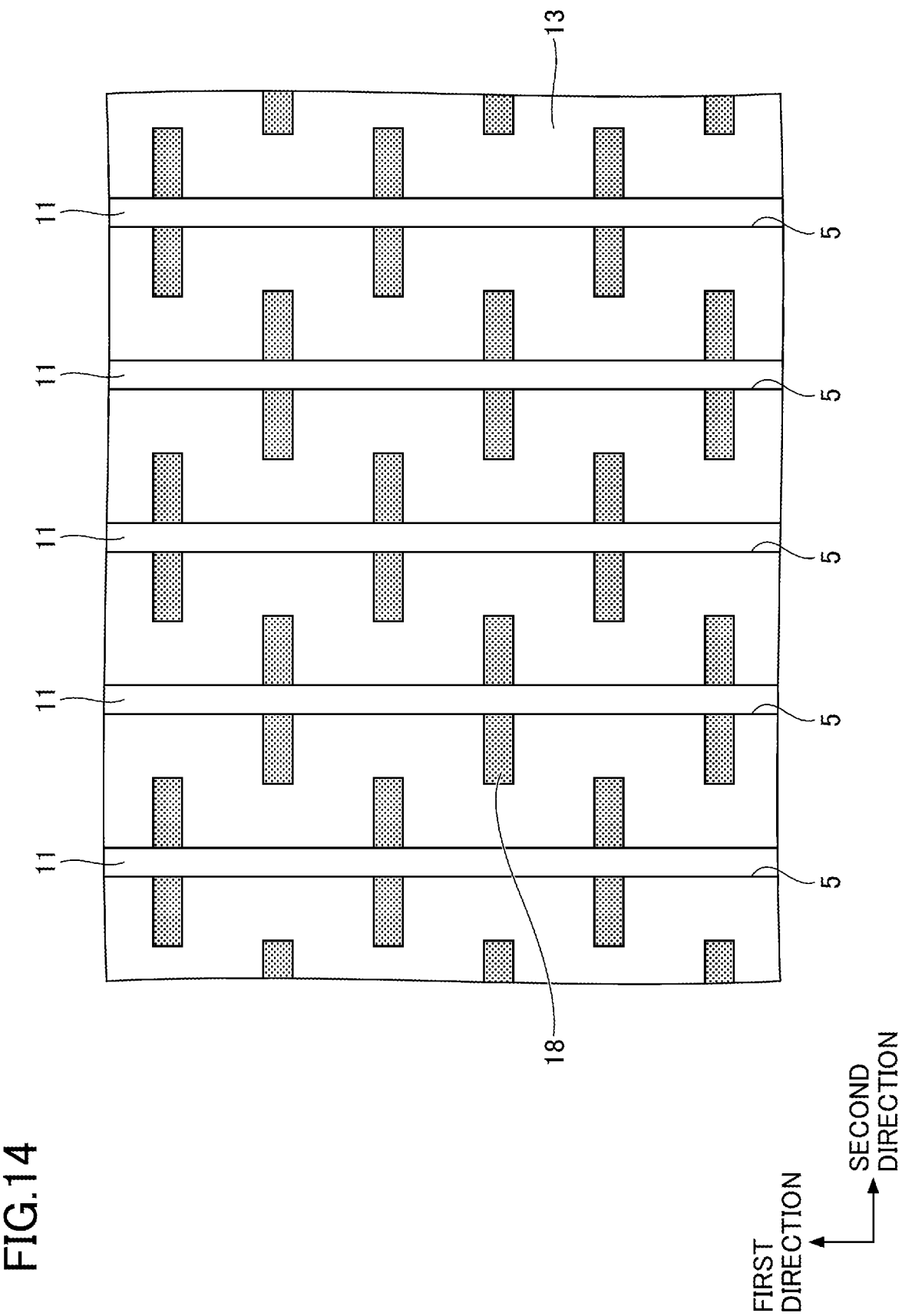
FIG. 14 is a diagram illustrating a relationship between the gate trench, the source region, and the contact region in the method of manufacturing the silicon carbide semiconductor device according to the embodiment.
Figure 15:
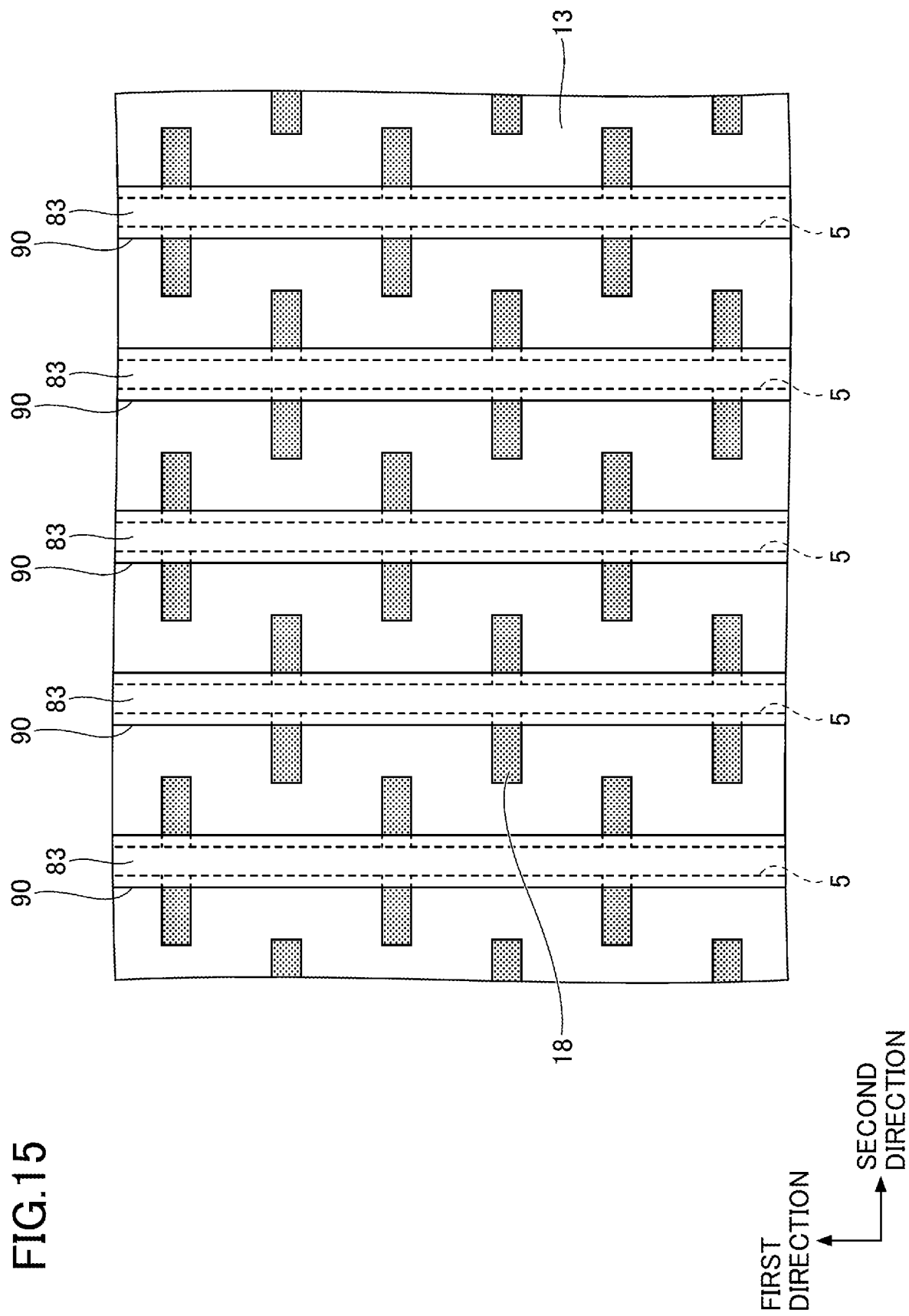
FIG. 15 is a diagram illustrating a relationship among the interlayer insulating film, the source region, and the contact region in the method of manufacturing the silicon carbide semiconductor device according to the embodiment.

Next, a method of manufacturing the MOSFET 100 according to the embodiment will be described. FIGS. 4 to 12 are cross-sectional views illustrating the method of manufacturing the MOSFET 100 according to the embodiment. FIGS. 4 to 12 indicate changes in the cross section illustrated in FIG. 2. FIG. 13 is a diagram illustrating a relationship between the source region 13 and the contact region 18 in the method of manufacturing the MOSFET 100 according to the embodiment. FIG. 14 is a diagram illustrating a relationship between the gate trench 5, the source region 13, and the contact region 18 in the method of manufacturing the MOSFET 100 according to the embodiment. FIG. 15 is a diagram illustrating a relationship between the interlayer insulating film 83, the source region 13, and the contact region 18 in the method of manufacturing the MOSFET 100 according to the embodiment.

Figure 4:
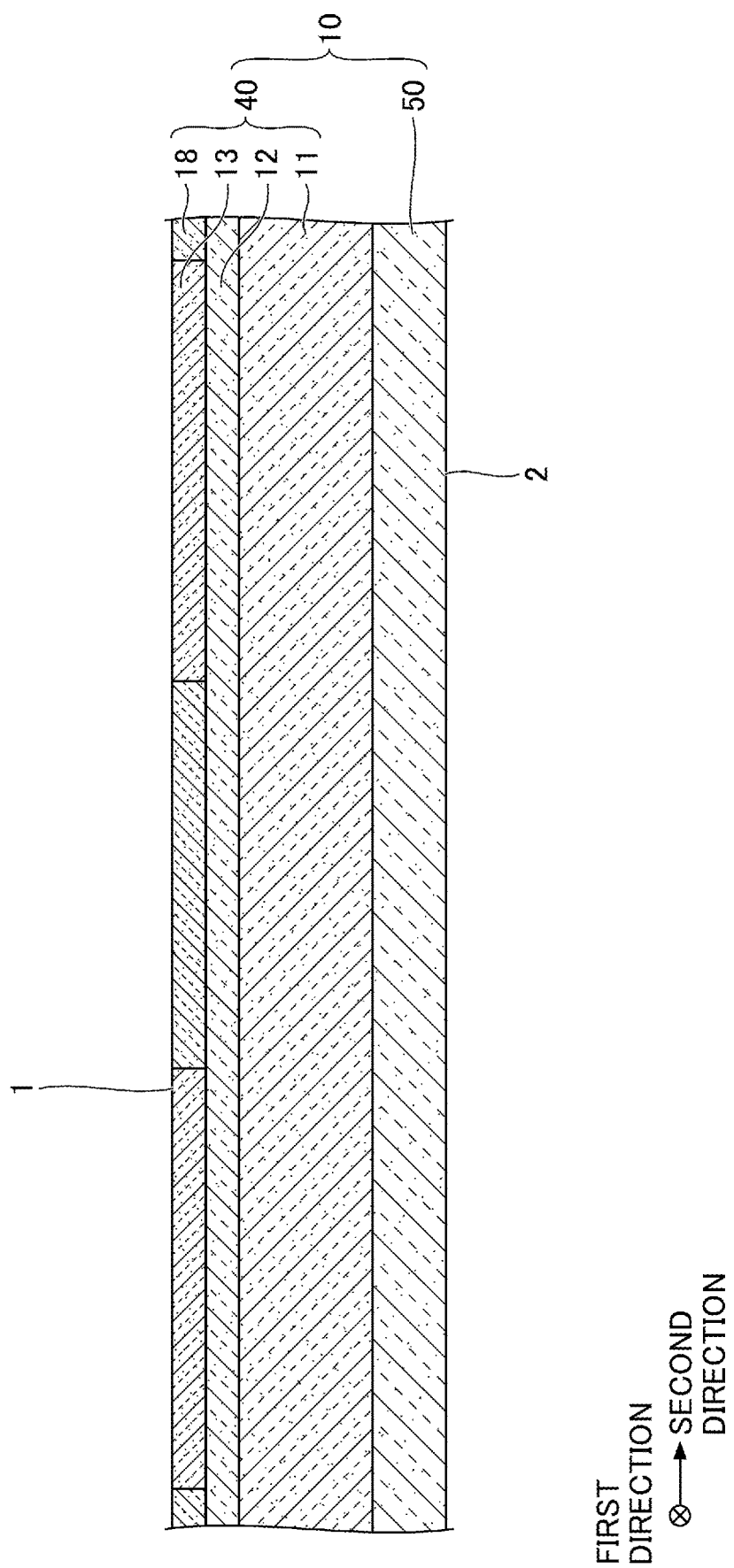
FIG. 4 is a cross-sectional view (part 1) illustrating a method of manufacturing the silicon carbide semiconductor device according to the embodiment.

First, as illustrated in FIG. 4 and FIG. 13, the drift region 11 is formed on the silicon carbide single-crystal substrate 50 by epitaxial growth. This epitaxial growth can be achieved by a chemical vapor deposition (CVD) method using, for example, a mixture gas of silane ($SiH_4$) and propane ($C_3H_8$) as a source gas, and, for example, a hydrogenous gas ($H_2$) as a carrier gas. Additionally, at this time, for example, nitrogen (N) or phosphorus (P) is preferably introduced as a donor. Next, the body region 12 on drift region 11 and the source region 13 on the body region 12 are formed. Specifically, ion implantation is performed on the upper surface of the drift region 11. In the ion implantation for forming the body region 12, for example, an acceptor such as aluminum (Al) is ion-implanted. In the ion implantation for forming the source region 13, for example, a donor such as phosphorus (P) is ion-implanted. With this, the silicon carbide substrate 10 including the drift region 11, the body region 12, and the source region 13 is formed. Here, instead of the ion implantation, epitaxial growth with addition of an impurity may be used. Next, the contact region 18 is formed by ion implantation. As illustrated in FIG. 13, the contact region 18 is formed in an island shape so as to intersect with a region where the gate trench 5 is formed. Next, activation heat treatment for activating the impurity added by ion implantation is performed. The temperature of the heat treatment is preferably 1,500° C. or greater and 1,900° C. or less, and is, for example, about 1,700° C. The period of time of the heat treatment is, for example, about 30 minutes. The atmosphere of the heat treatment is preferably an inert gas atmosphere, and is, for example, an Ar atmosphere. The silicon carbide substrate 10 is prepared as described above.

Figure 5:
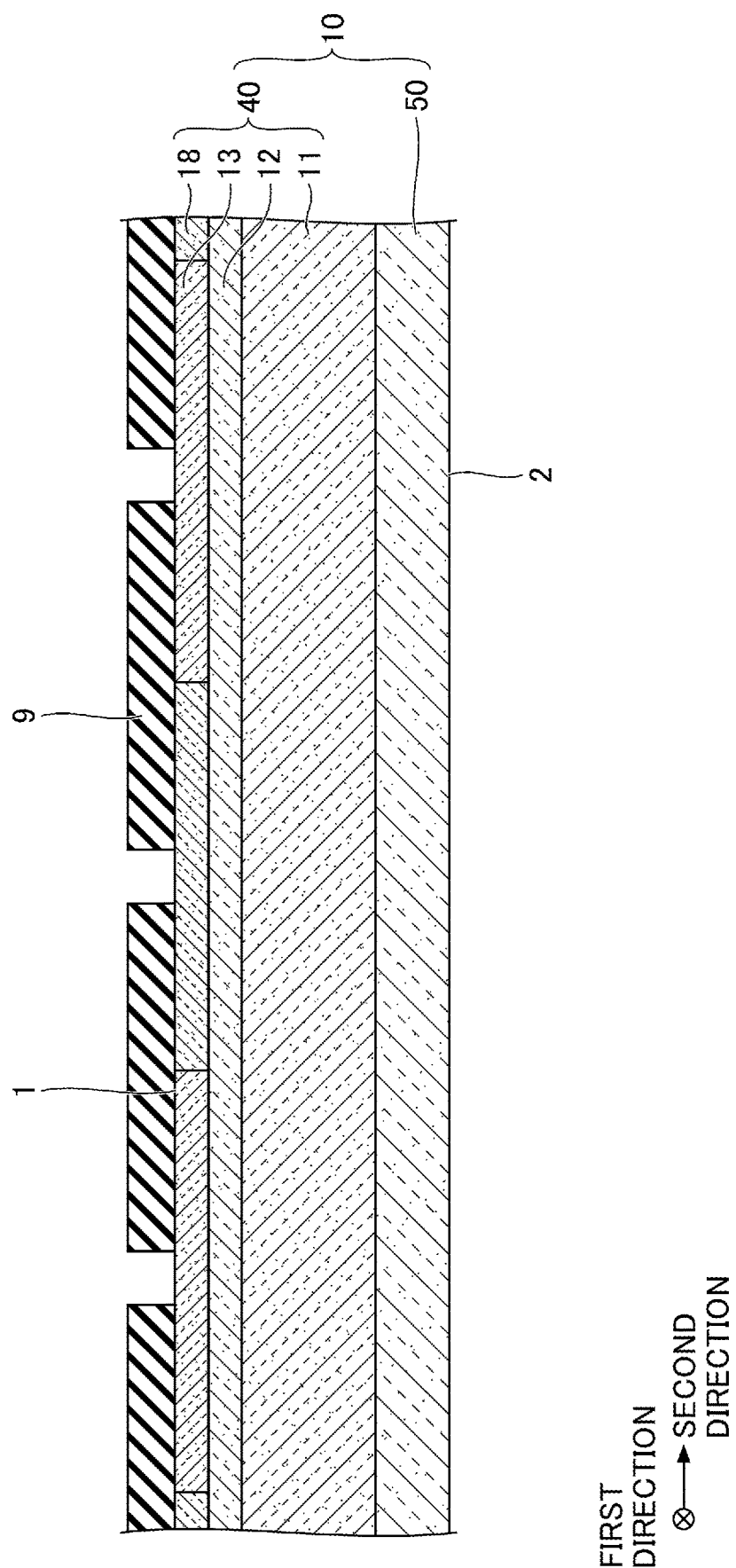
FIG. 5 is a cross-sectional view (part 2) illustrating the method of manufacturing the silicon carbide semiconductor device according to the embodiment.

Next, as illustrated in FIG. 5, a mask 9 having openings in which the source region 13 and the contact region 18 are partially exposed is formed on the silicon carbide substrate 10. The opening is formed corresponding to the position of the gate trench 5. As the mask 9, for example, a silicon oxide film formed by thermal oxidation can be used.

Figure 6:
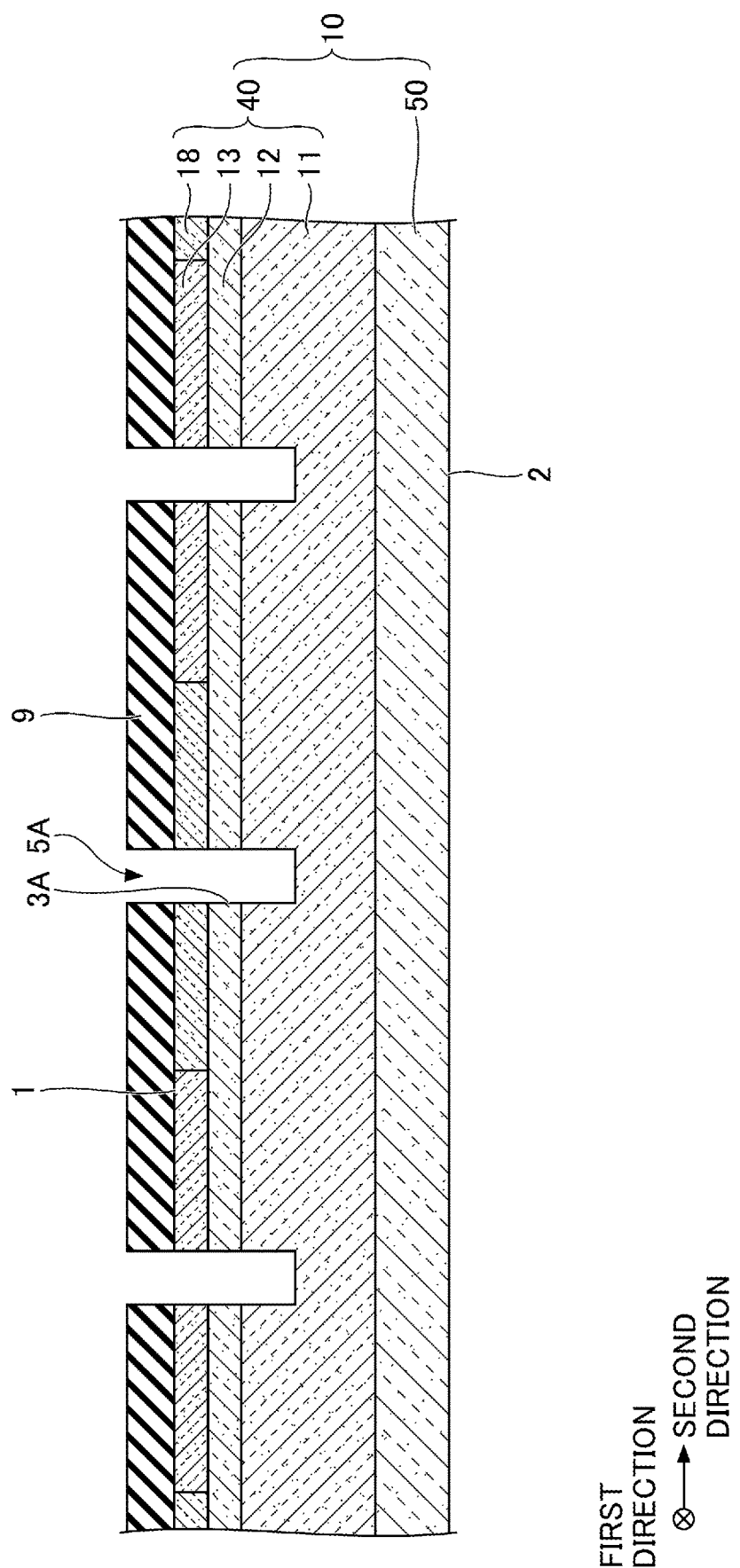
FIG. 6 is a cross-sectional view (part 3) illustrating the method of manufacturing the silicon carbide semiconductor device according to the embodiment.

Next, as illustrated in FIG. 6, in the openings of the mask 9, the source region 13, the contact region 18, the body region 12, and a portion of the drift region 11 are removed by etching. As the etching method, for example, reactive ion etching (RIE), particularly, inductive coupled plasma (ICP) RIE can be used. Specifically, for example, ICP-RIE using $SF_6$ or a mixture gas of $SF_6$ and $O_2$ as a reactive gas can be used. By such etching, a recess 5A having an inner surface 3A whose side surface is substantially perpendicular to the main surface of the silicon carbide single-crystal substrate 50 can be formed in a region where the gate trench 5 is to be formed.

Next, the silicon carbide substrate 10 is etched using the mask 9. Specifically, thermal etching is performed on the silicon carbide substrate 10 at the inner surface 3A of the recess 5A. Thermal etching can be performed, for example, by heating the silicon carbide substrate 10 in an atmosphere containing a reactive gas including at least one or more types of halogen atoms. The at least one or more types of halogen atoms include at least either a chlorine (Cl) atom or a fluorine (F) atom. This atmosphere is, for example, $Cl_2$, $BCl_3$, $SF_6$, or $CF_4$. For example, a mixture gas of a chlorine gas and an oxygen gas is used as a reaction gas, and thermal etching is performed at a heat treatment temperature of, for example, 700° C. or greater and 1,000° C. or less. Here, the reaction gas may contain a carrier gas in addition to the chlorine gas and the oxygen gas. As the carrier gas, for example, a nitrogen ($N_2$) gas, an argon gas, a helium gas, or the like may be used. When the heat treatment temperature is set to 700° C. or greater and 1,000° C. or less as described above, the etching rate of SiC is, for example, about 70 μm/hour. Additionally, in this case, the mask 9 made of silicon oxide is substantially not etched during the etching of SiC because the etching selectivity of silicon oxide to SiC is extremely high.

Figure 7:
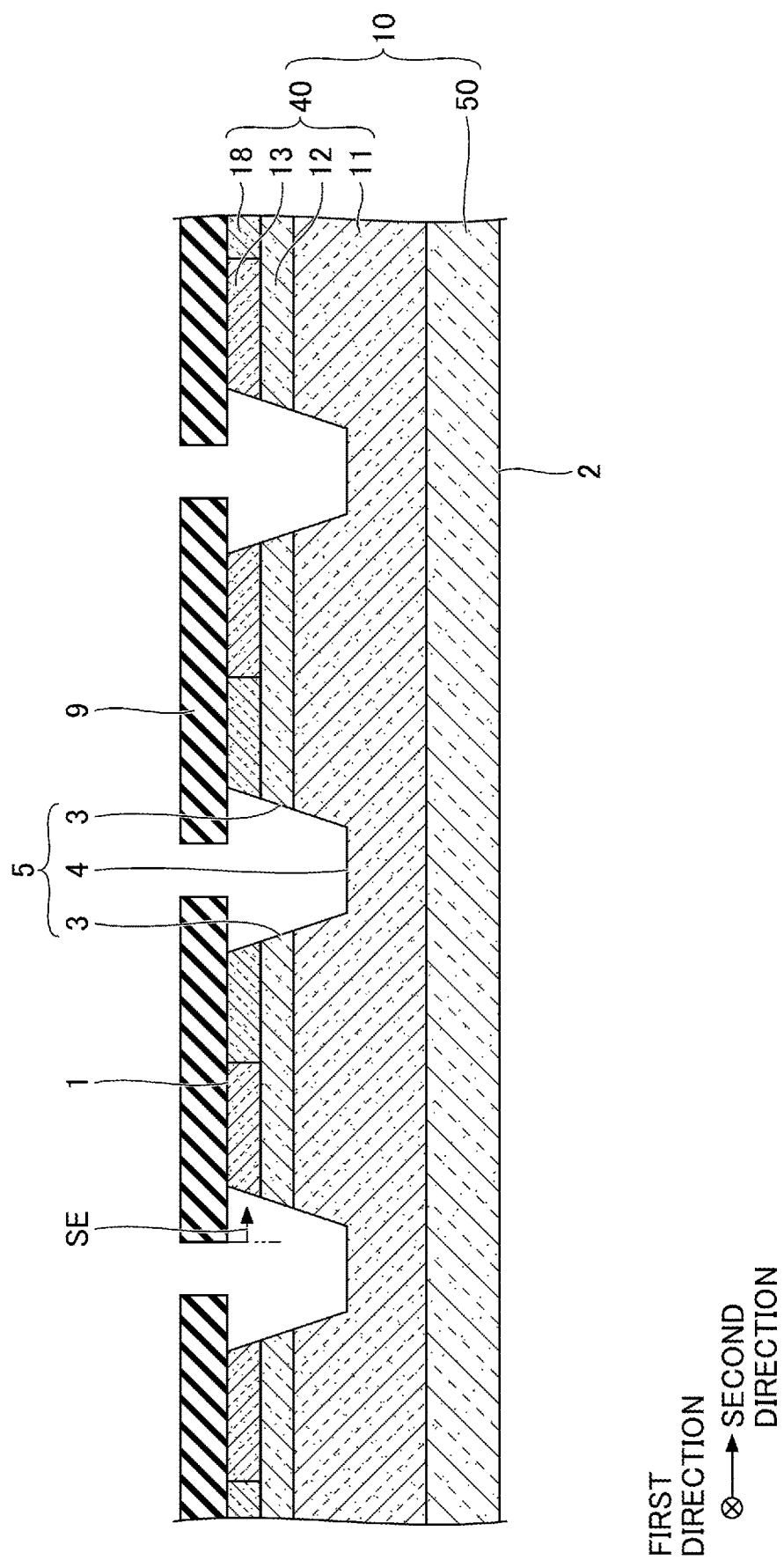
FIG. 7 is a cross-sectional view (part 4) illustrating the method of manufacturing the silicon carbide semiconductor device according to the embodiment.

As illustrated in FIG. 7 and FIG. 14, the gate trench 5 having the side surface 3 and the bottom surface 4 is formed in silicon carbide substrate 10 by the thermal etching described above. When the gate trench 5 is being formed, the silicon carbide substrate 10 is etched such that the silicon carbide substrate 10 is side-etched from the opening of the mask 9 as indicated by the arrow SE. Additionally, during the thermal etching, a {0-33-8} plane is self-formed on the side surface 3.

Figure 8:
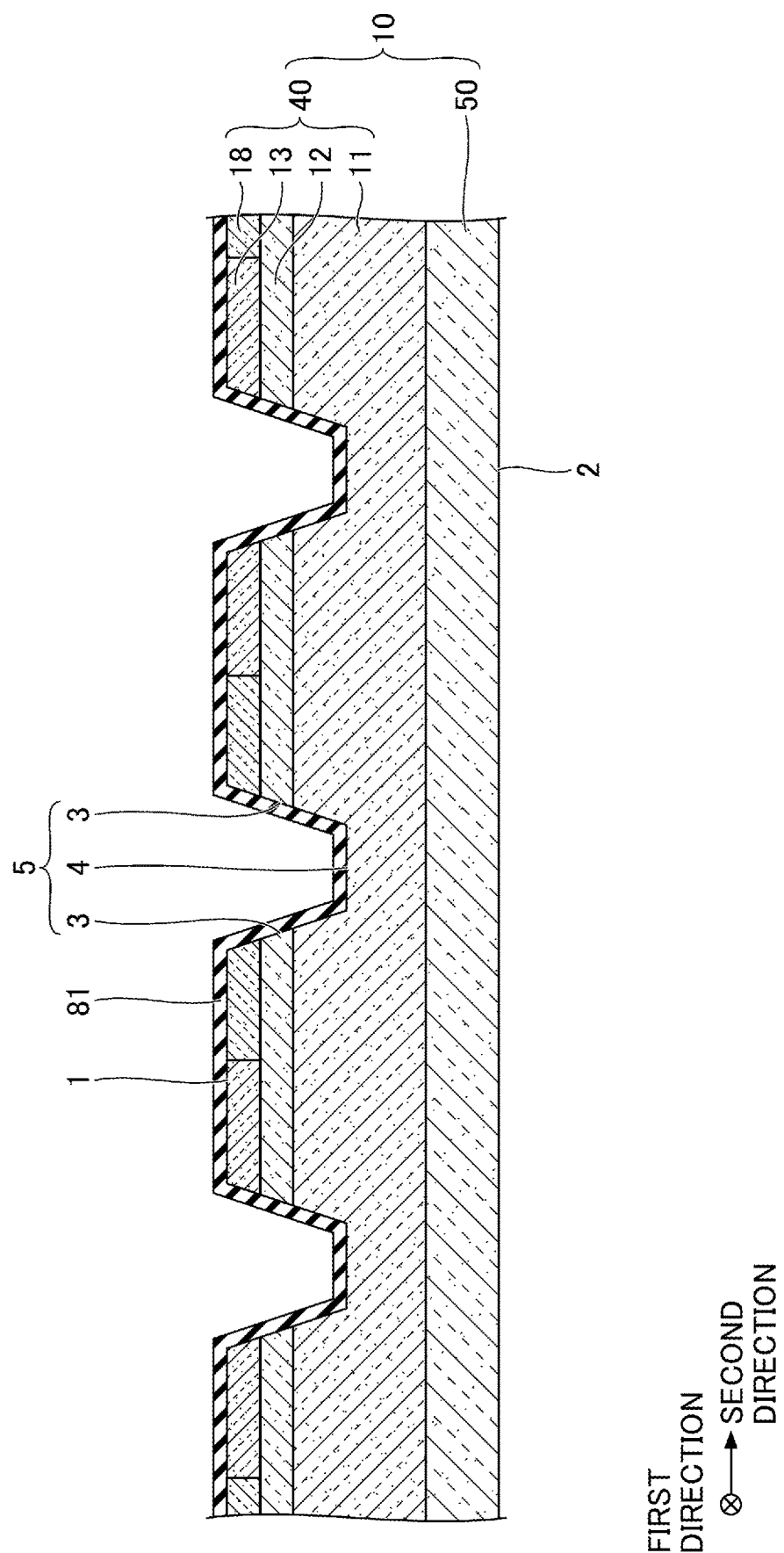
FIG. 8 is a cross-sectional view (part 5) illustrating the method of manufacturing the silicon carbide semiconductor device according to the embodiment.

Next, as illustrated in FIG. 8, the mask 9 is removed from the first main surface 1, and the gate insulating film 81 is formed. For example, the silicon carbide substrate 10 is thermally oxidized to form the gate insulating film 81 that is in contact with the source region 13, the body region 12, the drift region 11, and the contact region 18. Specifically, the silicon carbide substrate 10 is heated at a temperature of 1,300° C. or greater and 1,400° C. or less, for example, in an atmosphere containing oxygen. Thereby, the gate insulating film 81 that is in contact with the first main surface 1, the side surface 3, and the bottom surface 4 is formed. Here, when the gate insulating film 81 is formed by thermal oxidation, strictly speaking, a portion of the silicon carbide substrate 10 is taken into the gate insulating film 81. Therefore, in the subsequent processing, it is assumed that the first main surface 1, the side surface 3, and the bottom surface 4 have slightly moved to the interface between the gate insulating film 81 and the silicon carbide substrate 10 after thermal oxidation.

Next, in a nitric oxide (NO) gas atmosphere, heat treatment (NO annealing) may be performed on the silicon carbide substrate 10. In the NO annealing, the silicon carbide substrate 10 is held for about one hour under a condition of 1,100° C. or greater and 1,400° C. or less, for example. Thereby, nitrogen atoms are introduced into an interface region between the gate insulating film 81 and the body region 12. As a result, formation of an interface state at the interface region is suppressed, so that channel mobility can be improved.

Figure 9:
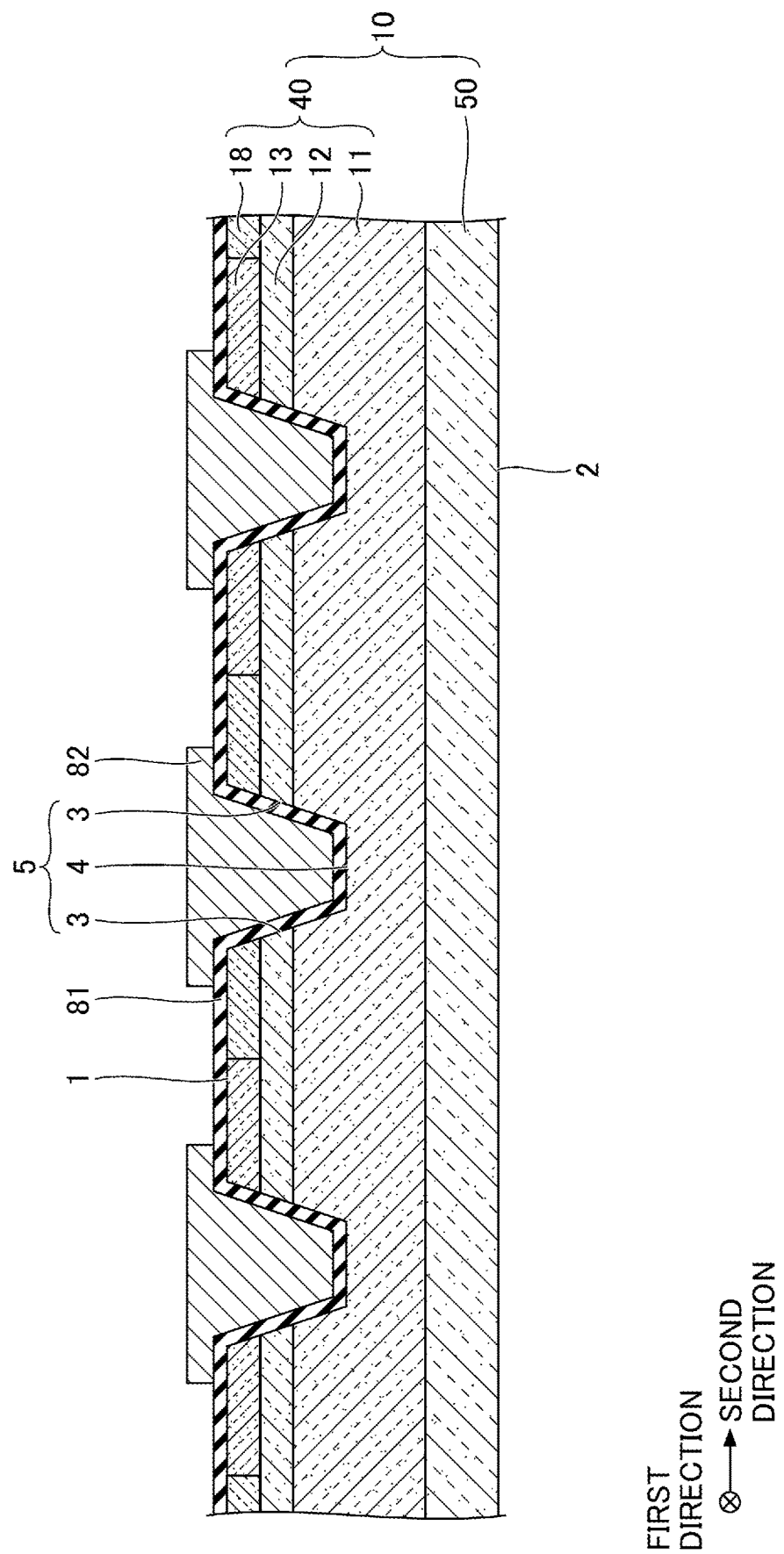
FIG. 9 is a cross-sectional view (part 6) illustrating the method of manufacturing the silicon carbide semiconductor device according to the embodiment.

Next, as illustrated in FIG. 9, the gate electrode 82 is formed. The gate electrode 82 is formed on the gate insulating film 81. The gate electrode 82 is formed by, for example, a low pressure-chemical vapor deposition (LP-CVD) method. The gate electrode 82 is formed such that the gate electrode 82 faces each of the source region 13, the body region 12, and the drift region 11.

Figure 10:
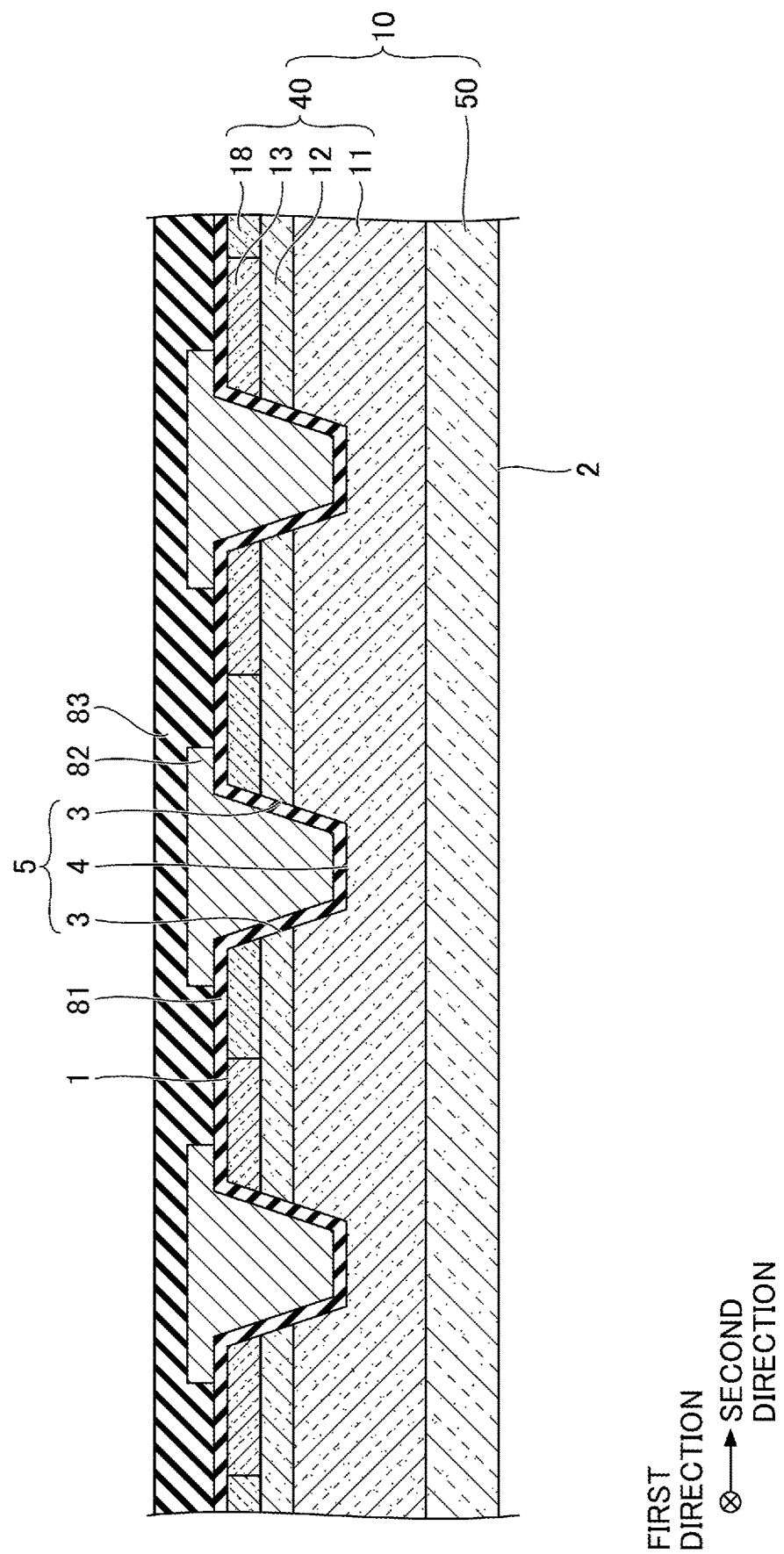
FIG. 10 is a cross-sectional view (part 7) illustrating the method of manufacturing the silicon carbide semiconductor device according to the embodiment.

Next, as illustrated in FIG. 10, the interlayer insulating film 83 is formed. Specifically, the interlayer insulating film 83 is formed to cover the gate electrode 82 and to be in contact with the gate insulating film 81. The interlayer insulating film 83 is formed by, for example, a CVD method. The interlayer insulating film 83 is made of, for example, a material containing silicon dioxide. A portion of the interlayer insulating film 83 may be formed inside the gate trench 5.

Figure 11:
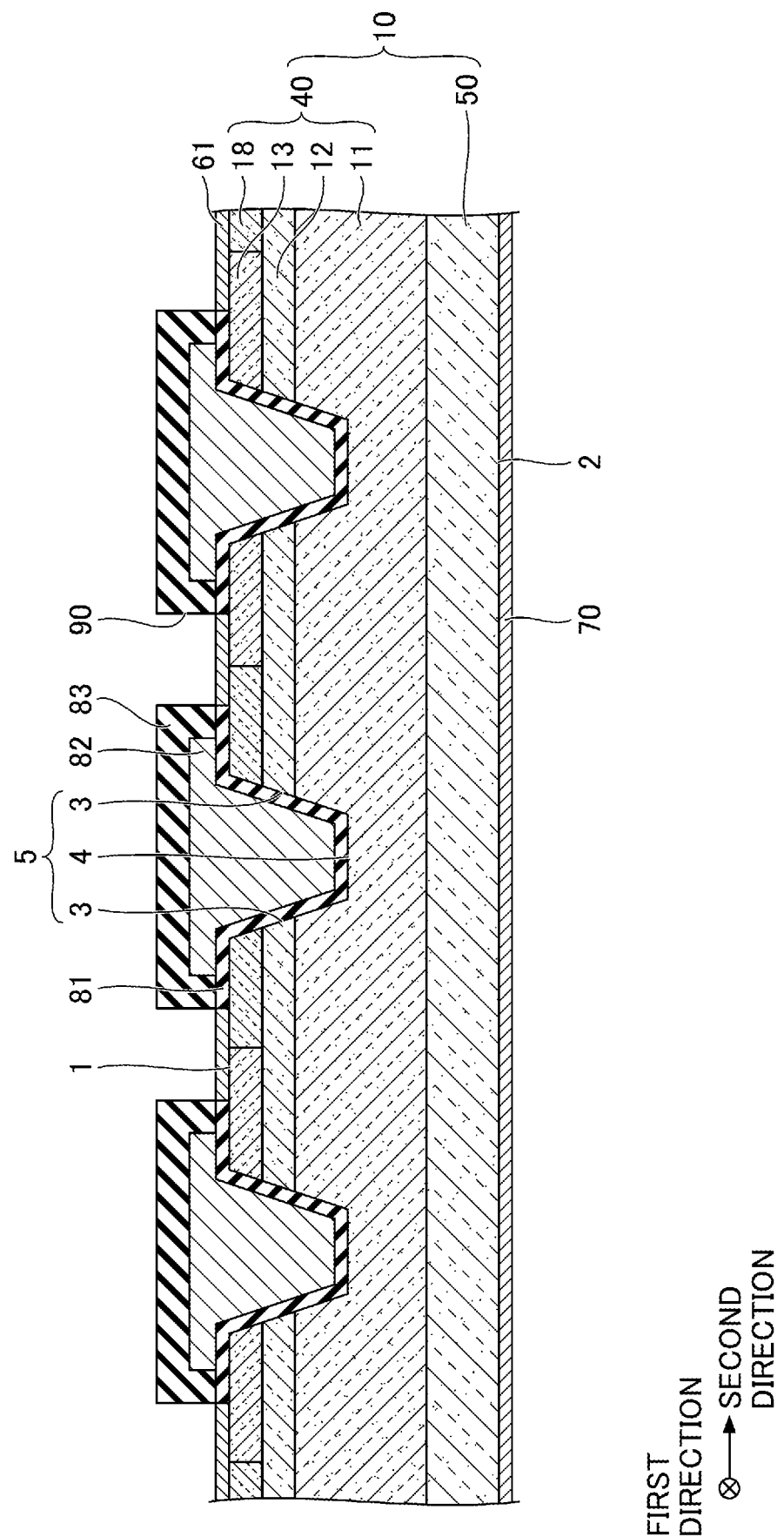
FIG. 11 is a cross-sectional view (part 8) illustrating the method of manufacturing the silicon carbide semiconductor device according to the embodiment.

Next, as illustrated in FIG. 11 and FIG. 15, the interlayer insulating film 83 and the gate insulating film 81 are etched to form the contact hole 90 in the interlayer insulating film 83 and the gate insulating film 81. As a result, the source region 13 and the contact region 18 are exposed from the interlayer insulating film 83 and the gate insulating film 81.

Next, a metal film (not illustrated) for the contact electrode 61 that is in contact with the source region 13 and the contact region 18 in the first main surface 1 is formed. The metal film for the contact electrode 61 is formed by, for example, sputtering. The metal film for the contact electrode 61 is made of, for example, a material containing Ni. Next, a metal film (not illustrated) for the drain electrode 70 that is in contact with the silicon carbide single-crystal substrate 50 at the second main surface 2 is formed. The metal film for the drain electrode 70 is formed by, for example, sputtering. The metal film for the drain electrode 70 is made of, for example, a material containing Ni.

Next, alloying annealing is performed. The metal film for the contact electrode 61 and the metal film for the drain electrode 70 are held, for example, at a temperature of 900° C. or greater and 1,100° C. or less for about 5 minutes. Thereby, at least a portion of the metal film for the contact electrode 61 and at least a portion of the metal film for the drain electrode 70 react with silicon contained in the silicon carbide substrate 10 to be silicided. As a result, the contact electrode 61 that is in ohmic contact with the source region 13 and the contact region 18, and the drain electrode 70 that is in ohmic contact with the silicon carbide single-crystal substrate 50 are formed. The contact electrode 61 may be made of a material containing Ti, Al, and Si. The drain electrode 70 may be made of a material containing Ti, Al, and Si.

Figure 12:
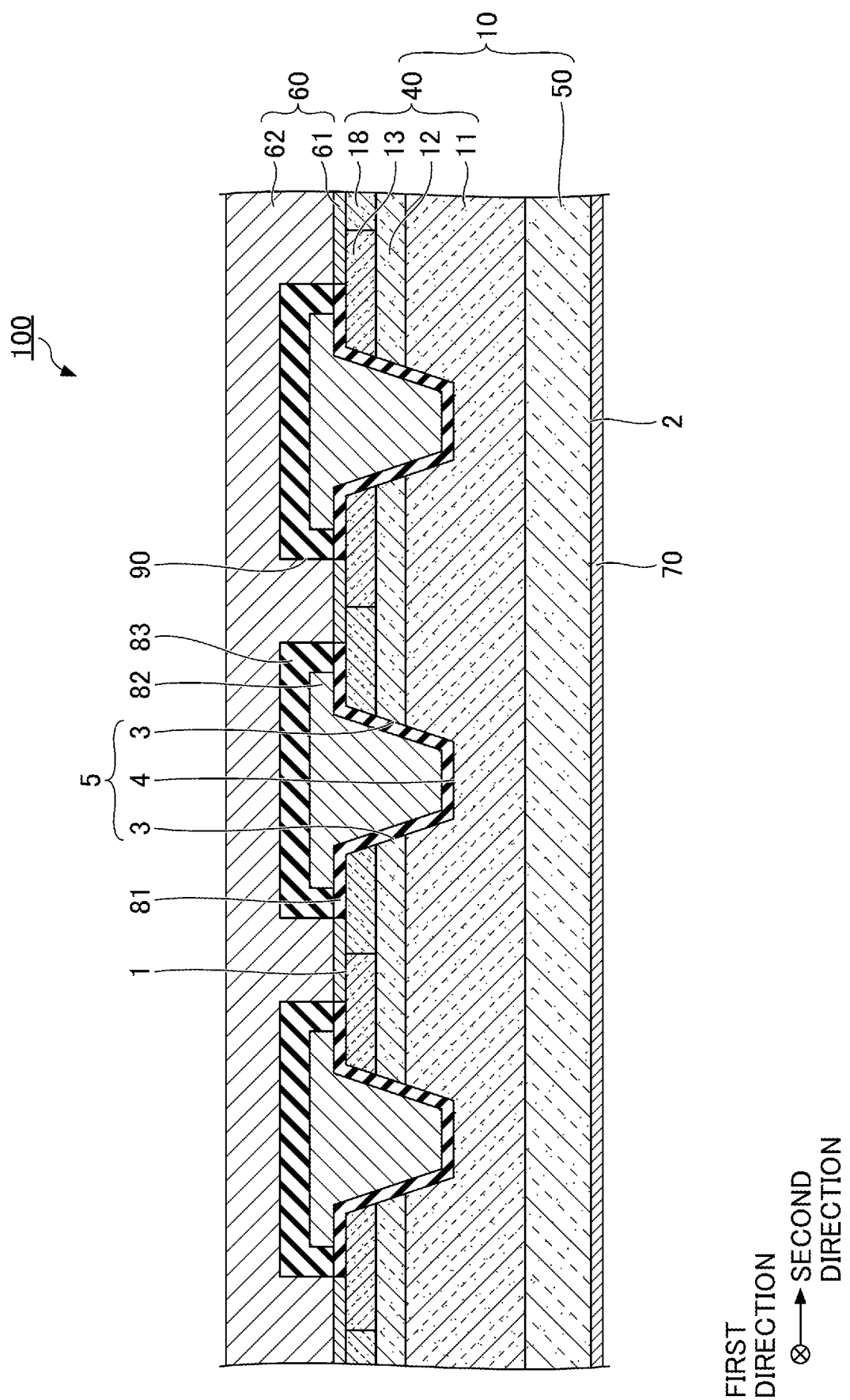
FIG. 12 is a cross-sectional view (part 9) illustrating the method of manufacturing the silicon carbide semiconductor device according to the embodiment.

Next, as illustrated in FIG. 12, the source wiring 62 is formed. Specifically, the source wiring 62 covering the contact electrode 61 and the interlayer insulating film 83 is formed. The source wiring 62 is formed by, for example, film deposition by sputtering and RIE. The source wiring 62 is made of, for example, a material containing aluminum. As described, the source electrode 60 including the contact electrode 61 and the source wiring 62 is formed.

As described above, the MOSFET 100 according to the embodiment is completed.

In the MOSFET 100 according to the present embodiment, a current flows between the source electrode 60 and the drain electrode 70 in the on-state. In this on-state, the current flows through the source region 13 yet does not flow through the contact region 18. That is, the source region 13 is a conductive region, and the contact region 18 is a non-conductive region. The contact region 18 is in contact with one gate trench 5 and is spaced apart from the adjacent gate trench 5. Thus, the source region 13 is present between the adjacent gate trench 5 and the contact region 18, and the source region 13 continues in the first direction. When the contact region 18 is in contact with two gate trenches 5, the source region 13 is divided by the contact region 18 in the first direction. Therefore, according to the present embodiment, a continuous conduction region in the first direction can be obtained. Additionally, although heat is generated when a current flows, because the conduction region continues in the first direction, the uniformity of heat generation can be improved and the uniformity of temperature distribution can be improved.

Figure 16:
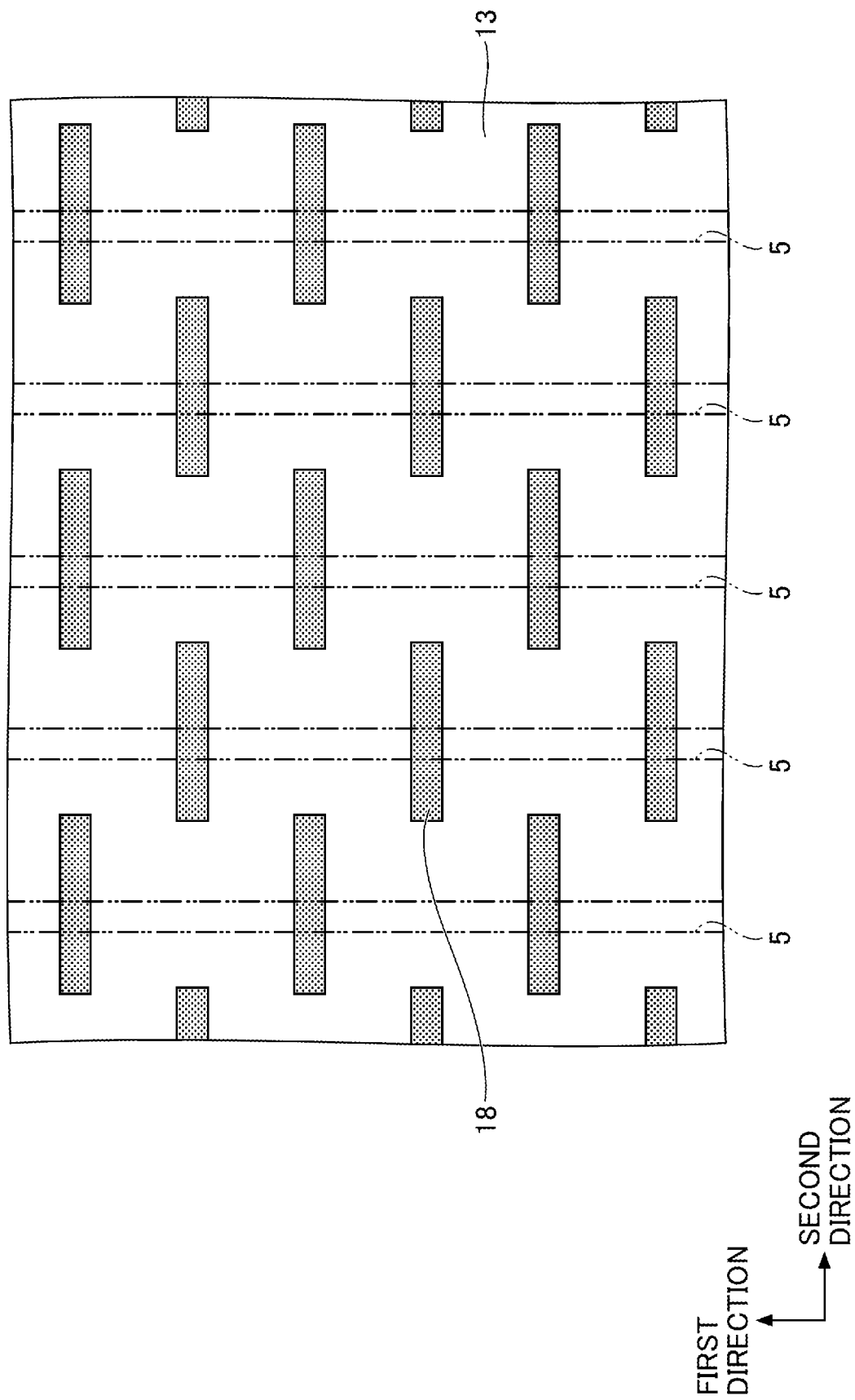
FIG. 16 is a diagram illustrating a relationship between the source region and the contact region when a shift in a position of a pattern occurs in the method of manufacturing the silicon carbide semiconductor device according to the embodiment.
Figure 17:
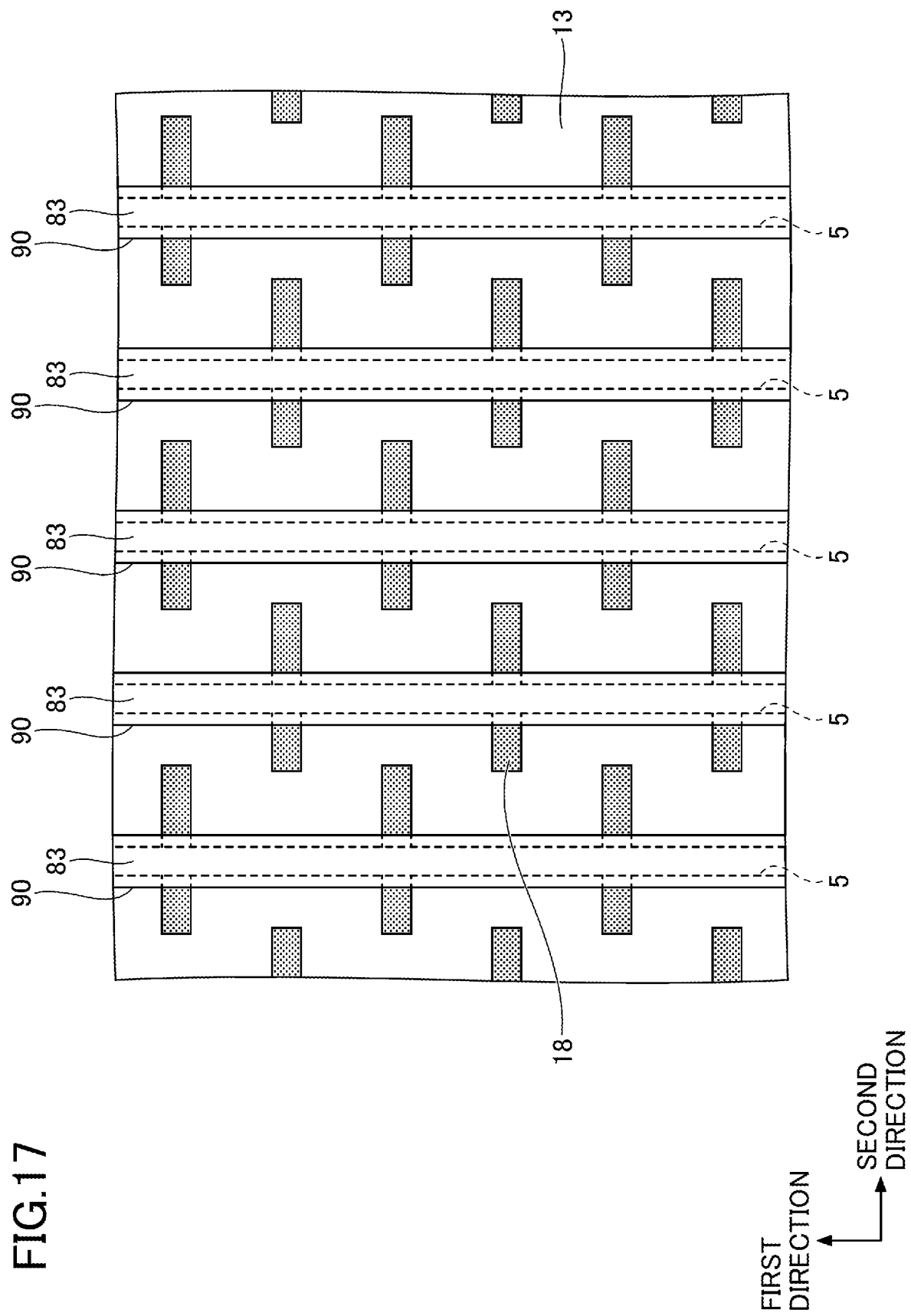
FIG. 17 is a diagram illustrating a relationship between the interlayer insulating film, the source region, and the contact region when the shift in the position of the pattern occurs in the method of manufacturing the silicon carbide semiconductor device according to the embodiment.
Figure 18:
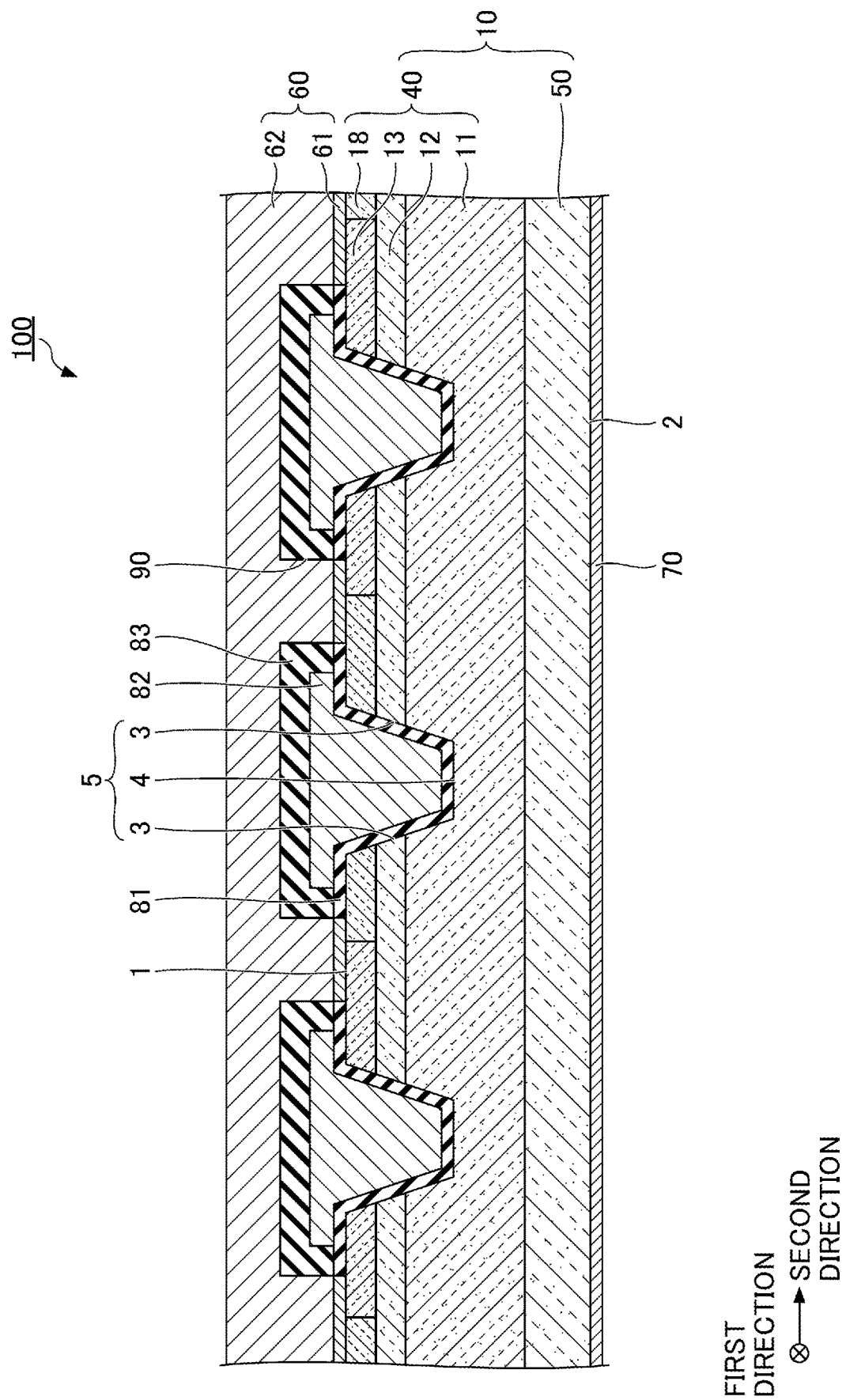
FIG. 18 is a cross-sectional view illustrating a configuration of the silicon carbide semiconductor device according to the embodiment in which the shift in the position of the pattern occurs.

Further, because the contact region 18 is in contact with one gate trench 5 from both sides in the second direction, as described below, even if a shift in a position of a pattern occurs during forming the contact region 18, the total area of the contact region 18 exposed to the contact hole 90 can be kept constant. FIGS. 16 to 18 are diagrams illustrating the MOSFET 100 in a case where the shift in the position of the pattern occurs. FIG. 16 is a diagram illustrating a relationship between the source region 13 and the contact region 18 when the shift in the position of the pattern occurs in the method of manufacturing the MOSFET 100 according to the embodiment. FIG. 17 is a diagram illustrating a relationship between the interlayer insulating film 83, the source region 13, and the contact region 18 in a case where the shift in the position of the pattern occurs in the manufacturing method of the MOSFET 100 according to the embodiment. FIG. 18 is a cross-sectional view illustrating a configuration of the MOSFET 100 according to the embodiment in which the shift in the position of the pattern occurs.

Here, as illustrated in FIG. 16, it is assumed that the contact region 18 is formed such that the contact region 18 is shifted in the second direction due to the shift in the position of the pattern. In such a case, in the MOSFET 100 manufactured by performing the processing of the above-described embodiment, as illustrated in FIG. 17 and FIG. 18, the shift in the position is still present in each contact region 18. However, the total area of the contact region 18 exposed in each contact hole 90 is the same as the total area in the case where no shift in the position occurs (see FIG. 15). Therefore, even if the position of the contact region 18 is shifted, the characteristics do not easily fluctuate, and stable characteristics can be obtained.

Additionally, in the present embodiment, because multiple contact regions 18 are arranged along the gate trench 5 in the first direction, the uniformity of the temperature distribution is easily increased.

The source region 13 continues in the first direction, so that a wide conduction region is obtained, and thus a current easily flows in a wider range. That is, a large current easily flows.

Multiple contact regions 18 are arranged in the second direction at every other one of multiple gate trenches 5, so that a large current easily flows and a potential is easily applied to the body region 12 from the source electrode 60.

Multiple contact regions 18 are arranged in an oblique lattice shape with respect to the first direction and the second direction, so that a large current easily flows and a potential is easily applied to the body region 12 from the source electrode 60.

Here, as illustrated in FIG. 1, multiple gate trenches 5 are arrayed at the first pitch P in the second direction, and the size L of the contact region 18 in the second direction is preferably 0.90 times the first pitch P or greater and 1.10 times the first pitch P or less, and more preferably 0.92 times the first pitch P or greater and 1.08 times the first pitch P or less. When the size L is less than 0.90 times the first pitch P, the contact region 18 becomes excessively small, and thus there is a possibility that a sufficient potential is not easily applied to the body region 12. When the size L exceeds 1.10 times the first pitch P, the contact region 18 becomes excessively large, and thus there is a possibility that the contact region 18 comes into contact with two adjacent gate trenches 5 when a shift in the position of the pattern occurs. When the contact region 18 is in contact with two adjacent gate trenches 5, there is a possibility that the conductive region is divided by the non-conductive region in the first direction, and thus the uniformity of heat generation decreases and the uniformity of temperature distribution decreases.

Although the embodiments have been described in detail above, the embodiments are not limited to specific embodiments, and various modifications and changes can be made within the scope described in the claims.

DESCRIPTION OF THE REFERENCE NUMERALS 1 first main surface
2 second main surface
3 side surface
3A inner surface
4 bottom surface
5 gate trench
5A recess
9 mask
10 silicon carbide substrate
11 drift region
12 body region
13 source region
18 contact region
40 silicon carbide epitaxial layer
50 silicon carbide single-crystal substrate
60 source electrode
61 contact electrode
62 source wiring
70 drain electrode
81 gate insulating film
82 gate electrode
83 interlayer insulating film
90 contact hole
100 MOSFET

The invention claimed is:

1. A silicon carbide semiconductor device comprising a silicon carbide substrate having a first main surface and a second main surface opposite to the first main surface, the silicon carbide substrate including:
a drift region that is a first conductivity type;
a body region that is a second conductivity type different from the first conductivity type, the body region being provided on the drift region;
a source region that is the first conductivity type, the source region being provided on the body region such that the source region is separated from the drift region;
a contact region that is the second conductivity type, the contact region being provided on the body region;
wherein a plurality of gate trenches are provided in the first main surface, each of the plurality of gate trenches being defined by side surfaces and a bottom surface, the side surfaces passing through the source region and the body region to reach the drift region, the bottom surface being continuous with the side surfaces, the plurality of gate trenches extending in a first direction parallel to the first main surface,
wherein the contact region is in contact with a first gate trench from both sides in a second direction orthogonal to the first direction and is spaced apart from a second gate trench adjacent to the first gate trench in the second direction, the first gate trench being one gate trench among the plurality of gate trenches,
wherein the plurality of gate trenches are arrayed in the second direction at a first pitch, and
wherein a size of the contact region in the second direction is 0.90 times the first pitch or greater and 1.10 times the first pitch or less.

2. The silicon carbide semiconductor device as claimed in claim 1, wherein a plurality of said contact regions are arranged in the first direction along the first gate trench.

3. The silicon carbide semiconductor device as claimed in claim 1, wherein the source region continues in the first direction between the first gate trench and the second gate trench.

4. A silicon carbide semiconductor device comprising a silicon carbide substrate having a first main surface and a second main surface opposite to the first main surface, the silicon carbide substrate including:
a drift region that is a first conductivity type;
a body region that is a second conductivity type different from the first conductivity type, the body region being provided on the drift region;
a source region that is the first conductivity type, the source region being provided on the body region such that the source region is separated from the drift region;
a plurality of contact regions, each of which is the second conductivity type, the plurality of contact regions being provided on the body region;
wherein a plurality of gate trenches are provided in the first main surface, each of the plurality of gate trenches being defined by side surfaces and a bottom surface, the side surfaces passing through the source region and the body region to reach the drift region, the bottom surface being continuous with the side surfaces, the plurality of gate trenches extending in a first direction parallel to the first main surface,
wherein two contact regions among the plurality of contact regions are in contact with a first gate trench from both sides in a second direction orthogonal to the first direction and are spaced apart from a second gate trench adjacent to the first gate trench in the second direction, the first gate trench being one gate trench among the plurality of gate trenches, and
wherein the plurality of contact regions are arranged at every other one of the plurality of gate trenches in the second direction.

5. The silicon carbide semiconductor device as claimed in claim 1, wherein a plurality of said contact regions are arranged in an oblique lattice shape with respect to the first direction and the second direction.

6. The silicon carbide semiconductor device as claimed in claim 1, wherein the side surfaces of each of the plurality of gate trenches include a {0-33-8} plane or {11-20} plane.

7. The silicon carbide semiconductor device as claimed in claim 4, wherein the side surfaces of each of the plurality of gate trenches include a {0-33-8} plane or {11-20} plane.

8. The silicon carbide semiconductor device as claimed in claim 1, wherein an angle of a first side surface among the side surfaces with respect to a plane including the bottom surface is 45° or greater and 65° or less.

9. The silicon carbide semiconductor device as claimed in claim 4, wherein an angle of a first side surface among the side surfaces with respect to a plane including the bottom surface is 45° or greater and 65° or less.

10. The silicon carbide semiconductor device as claimed in claim 4, wherein no contact region is provided at the second gate trench along a straight line connecting the two contact regions in the second direction.

11. The silicon carbide semiconductor device as claimed in claim 4, wherein the source region is provided at the second gate trench along a straight line connecting the two contact regions in the second direction.

\* \* \* \* \*